(12) United States Patent
Fujiwara et al.

(10) Patent No.: US 7,211,934 B2
(45) Date of Patent: May 1, 2007

(54) ELECTRONIC DEVICE AND METHOD OF MANUFACTURING THE SAME

(75) Inventors: Shinichi Fujiwara, Yokohama (JP);
Masahide Harada, Yokohama (JP);
Kunio Matsumoto, Kosigaya (JP); Eiji Matsuzaki, Yokohama (JP)

(73) Assignees: Hitachi, Ltd., Tokyo (JP); Hitachi Media Electronics Co., Ltd., Mizusawa-shi (JP)

( * ) Notice: Subject to any disclaimer, the term of this patent is extended or adjusted under 35 U.S.C. 154(b) by 10 days.

(21) Appl. No.: 10/750,821

(22) Filed: Jan. 5, 2004

(65) Prior Publication Data
US 2004/0159960 A1     Aug. 19, 2004

(30) Foreign Application Priority Data
Jan. 7, 2003     (JP)     ............................. 2003-000789

(51) Int. Cl.
*H01L 41/08* (2006.01)
(52) U.S. Cl. ................... 310/348; 310/313 R; 310/344
(58) Field of Classification Search ............ 310/313 R, 310/344–346, 348, 340
See application file for complete search history.

(56) References Cited
U.S. PATENT DOCUMENTS

| | | | |
|---|---|---|---|
| 4,293,986 A * | 10/1981 | Kobayashi et al. | 29/25.35 |
| 4,362,961 A * | 12/1982 | Gerber | 310/370 |
| 4,734,608 A * | 3/1988 | Takoshima | 310/313 R |
| 5,850,677 A * | 12/1998 | Ryoichi | 29/25.35 |
| 6,498,422 B1 * | 12/2002 | Hori | 310/344 |
| 6,606,772 B1 * | 8/2003 | Nohara et al. | 29/25.35 |
| 2004/0100164 A1 | 5/2004 | Murata et al. | |

FOREIGN PATENT DOCUMENTS

| | | |
|---|---|---|
| JP | 03-049246 | 3/1991 |
| JP | 04-293310 | 10/1992 |
| JP | A-4-293311 | 10/1992 |
| JP | A-8-18390 | 1/1996 |
| JP | A-8-316778 | 11/1996 |
| JP | 09-129781 | 5/1997 |
| JP | A-9-289429 | 11/1997 |
| JP | 10-032223 | 2/1998 |
| JP | 10-256302 | 9/1998 |
| JP | 2001-094390 | 4/2001 |
| JP | 2001-110845 | 4/2001 |
| JP | A-2001-94390 | 4/2001 |
| JP | A-2003-000789 | 1/2003 |
| JP | 2003-078389 | 3/2003 |
| JP | 2003-78389 | 3/2003 |

* cited by examiner

*Primary Examiner*—Mark Budd
(74) *Attorney, Agent, or Firm*—Antonelli, Terry, Stout & Kraus, LLP.

(57) ABSTRACT

An electronic device of a chip size having improved airtightness is designed to be formed by a reduced number of process steps. An electronic component including a chip having a functional surface and electrodes at least on one side and a substrate having a portion which can be connected to the electrodes of the chip is designed as such an electronic device. In the electronic component, electroconductive glass or an intermetallic compound is used for connection portions to establish electrical connections between the chip and the substrate and to simultaneously seal the device surface on the chip.

22 Claims, 12 Drawing Sheets

ELECTRONIC DEVICE AND METHOD OF MANUFACTURING THE SAME

The disclosure of JP-A-2003-000789 filed on Jan. 7, 2003 including the specification, drawings and abstract is incorporated herein by reference in its entirety.

BACKGROUND

The present invention relates to an electronic component which needs to be sealed in an airtight manner and a method of manufacturing the electronic component part. More particularly, the present invention relates to a technique effective in an application to a surface acoustic wave device.

A surface acoustic wave device used as a high-frequency filter for portable telephones, etc., is formed in such a manner that a pair of interdigital electrodes are formed on a surface of a piezoelectric monocrystal chip such as a lithium tantalate ($LiTaO_3$) chip or a lithium niobate ($LiNbO_3$) chip (hereinafter referred to as "SAW chip"), the chip is mounted on a package substrate, and input and output electrodes on the package substrate are electrically connected to the pair of interdigital electrodes.

Ordinarily, a SAW chip is die-bonded to a ceramic package substrate while being positioned so that the chip surface on which a surface acoustic wave propagates, i.e., the surface on which the pair of interdigital electrodes are formed, faces upward, and chip electrodes connected to the pair of interdigital electrodes are electrically connected to internal electrodes on the package substrate by bonding using metallic wires mainly formed of Al or Au. The chip is thereafter sealed with a metallic cap in an airtight manner to form a surface acoustic wave device.

In recent years, there has been a strong demand for reducing the size of components of portable telephones, etc.

To meet the demand, the size of surface acoustic wave devices is reduced by eliminating the wire bonding area in such a manner that the SAW chip is flip-chip-connected to the package substrate.

JP-A-8-316778 discloses a typical device structure relating to such a size reduction method. FIG. 17 shows a diagram schematically showing the device structure.

According to this related art document, a SAW chip 100 having a flow prevention frame 320 formed so as to surround interdigital electrodes 110 is flip-chip-connected to the a package substrate 200 with bumps 400 interposed therebetween, and a sealing resin 310 is injected from a side surface of the SAW chip 100 and is set, thereby forming a surface acoustic wave device.

The sealing resin 310 is stopped by the flow prevention frame 320 at the time of injection. A space 500 is therefore formed on the interdigital electrode 110 surface side to ensure propagation of a surface acoustic wave. The bumps 400 are formed by an Au wire bump method and are connected to the package substrate 200 by a solder or an electroconductive resin.

Known documents relating to the present invention include JP-A-2001-94390, JP-A-4-293311 and JP-A-9-289429 as well as the above-mentioned JP-A-8-316778.

SUMMARY

The above-described flip-chip package device is considered to have the following problems:

(1) a problem in terms of manufacture, i.e., a problem that while there is a need to form the flow prevention frame 320 so that height of the flow prevention frame 320 is slightly smaller than the bump connection height, a gap is formed between the flow prevention frame 320 and the bumps 400 because of variation in height of the bumps 400 and variation in flatness of the package substrate 200, and there is, therefore, a possibility of failure to completely stop the sealing resin 310 from flowing in;

(2) a problem in terms of reliability, i.e., a problem that since a resin is used as the sealing resin, considerable degradation in surface acoustic wave propagation characteristic is caused if water enters and condenses at an interdigital electrode portion using long-time use, and there is also a possibility of the interdigital electrodes being corroded and disconnected by condensation of water; and (3) a problem in terms of structure, i.e., a problem that since there is a need for the package substrate 200 larger in size than the SAW chip 100, there is a limit to the reduction in size of the conventional package device, and the size of the device cannot be reduced to the chip size.

JP-A-2001-94390 discloses a method in which a substrate and a chip equal in size to each other are used and an electroconductive adhesive is used for peripheral sealing, and which makes it possible to form an electronic component of size equal to the size of the chip. This method, however, has a problem that the electrical resistance of the electroconductive adhesive is high and the electroconductive adhesive is not suitable for an airtight package.

As described above, the conventional flip-chip package has problems in terms of manufacture, reliability and structure. A solution to the problem (1) in terms of manufacture is the development of a sealing method which ensures that the sealing material does not reach the interdigital electrodes. A solution to the problem (2) in terms of reliability is the selection of a material capable of complete airtight sealing. A solution to the problem (3) in terms of structure is the development of a package device of a SAW chip size considered to be a minimum size.

In a case where a semiconductor chip is bonded to a substrate by using a solder as shown in FIG. 1 in JP-A-4-293311, there is a need to use a flux for the purpose of removing a solder oxide film formed at the time of reflowing, and a gas is generated from the flux at the time of reflowing. This gas can corrode the interdigital electrodes (IDTs) and attach a gas component to the IDT surface and can therefore be a cause of degradation in SAW filter characteristics (an increase in pass loss, a disconnection failure, a pass frequency shift). A SAW filter is a functional device for extracting a particular frequency in a certain range and such frequency characteristic degradation in a SAW filter is a serious problem. If a SAW filter having such degradation is used in a portable telephone, a fault occurs in the receiving function.

In a case where a multi-chip module (MCM) structure in which a SAW filter is mounted on an interposer substrate together with other electronic components is used, there is a problem that the selection of connection materials, particularly a soldering materials is restricted because the melting point of a bonding material used in a connection step after mounting of the SAW filter is low.

An object of the present invention is to provide a surface acoustic wave device in which a sealing material is prevented from reaching interdigital electrodes, which has improved reliability and producibility, and which can be manufactured at a lower cost, and a method of manufacturing such improved surface acoustic wave device.

Another object of the present invention is to provide technique capable of limiting degradation in frequency characteristics of a SAW filter.

Still another object of the present invention is to provide a technique enabling setting of a high temperature level in manufacture of an electronic module using an MCM structure having a SAW filter mounted on an interposer while limiting degradation in frequency characteristics of the electronic module.

Typical modes of implementation of the present invention disclosed in this specification will be briefly described below.

An electronic device provided to achieve the above-described object of the present invention is an electronic component having an electronic circuit element having an electrode and a substrate having a portion which can be connected to the electrode of the electronic circuit element, wherein an electrical connection is made between the electronic circuit element and the substrate, and a device surface on the electronic circuit element is sealed to ensure the formation of a space between the substrate and the electronic circuit element.

The electrical connection and sealing between a SAW chip and a package substrate in the chip-size electronic device of the present invention are achieved, for example, by two means described below.

The first means includes making metallic connection by hot pressure bonding for the electrical connection and sealing between the SAW chip and the package substrate. Internal electrodes and a sealing portion of a multiple-piece-forming package substrate are plated with Sn, Ag or Au in advance. Also, chip electrode portions and chip peripheral portions on a surface acoustic wave wafer are plated with Au. The substrate and the surface acoustic wave wafer are positioned in a state of being opposed to each other and are heated and pressed to complete the electrical connections and sealing of a plurality of chips at a time. By such a connecting operation, an Au—Sn bond, an Au—Ag bond, an Au—Al bond or an Au—Au bond is formed in the electrode connection and the sealing portion. The bonding metals do not flow at the time of connection and the spacing between the SAW chip and the package substrate after connection is substantially equal to the plating thickness between the SAW chip and the package substrate, thus ensuring the formation of a space along the SAW chip interdigital electrode portion.

The second means uses an electroconductive glass having low flowability as a material for the above-described electrical connection and sealing. On a multiple-piece-forming package substrate which is made of a ceramic or glass and on which internal and external electrodes are formed in advance, the electroconductive glass frit is printed or fused at the positions of a peripheral portion and electrodes of a SAW chip to be mounted. SAW elements on a wafer are opposed to and placed on the substrate, followed by heating and pressing. The electroconductive glass is thereby fused to the wafer. Thus, a plurality of chips formed on the wafer are sealed at a time and are simultaneously connected electrically. A spacer in the form of fine particles formed of spacer glass balls of several microns, spacer glass rods or electroconductive particles may be mixed in the electroconductive glass to secure the desired connection height and to ensure that the desired space can be formed along the SAW chip interdigital electrode portion.

In the final step, the chips are separated by cutting with a dicer along the center lines of the sealing portions, thereby obtaining the chip-size surface acoustic wave device. Alternatively, grooving at the centers of the sealing portions is performed by sandblasting in the direction of mounting of the SAW chip to a depth reaching the substrate, metalization by evaporation or plating is performed from the upper surface, and the grooved portions are broken or cut by dicing to separate the chips, thus forming the chip-size surface acoustic wave device. By the latter method, a chip-size surface acoustic wave device electromagnetically shielded by metalization on the back surface of the device can be obtained. The electromagnetic shielding portion and a ground terminal on the substrate may be connected to improve the electromagnetic shielding effect.

In the case of connection and sealing with electroconductive glass, it is preferred that the SAW chip electrodes and the package substrate electrodes be plated with Au in advance in order to reliably establish electrical connections therebetween.

As described above, if a hot pressure bonding metal is used as a sealing material, substantially no flow of the sealing material is caused at the time of sealing and the need for a flow prevention frame is eliminated. In a case where electroconductive glass is used as a sealing material, the flowability of the material is low even at the time of melting and the sealing material does not reach the interdigital electrodes even if no flow prevention frame exists. Thus, the above-mentioned solution (1) can be attained. Also, since the sealing material is a metal or glass, completely airtight sealing is possible and the solution (2) can therefore be attained. Further, sealing and electrical connection is provided on the wafer level and the wafer is selected into individual SAW chip package devices in the final step, and the solution (3) can therefore be attained.

In one mode of implementation of the present invention, a metal bonding method using no flux is used as a SAW filter connection method in order to achieve the above-described objects.

Also, a gold-tin bonding method among metal connection method using no flux may be used in order to broaden the range of selection of bonding materials used for mounting of other electronic components (to enable use of a bonding material having a high melting point) after mounting of the SAW filter.

Different temperature levels can easily be set because the gold-tin bonding by heating and pressing produces a gold-tin alloy having a melting point of about 280 degrees much higher than the melting point of tin. In particular, a solder having a melting point higher than the temperature at which the SAW filter is boded and lower than the melting point of the gold-tin alloy (particularly an eutectic solder or lead-free solder) can be used after bonding of the SAW filter. If this characteristic is applied to a MCM structure in which a SAW filter having a solder is mounted on an interposer substrate together with other electronic components, the bonding temperature for mounting of the interposer substrate on a mother substrate can be increased.

In a case where sealing is performed at a connection formed around a signal electrode, bonding of the signal terminal and sealing can be performed in one step if a metal bonding method using no flux is used for this bonding, thereby reducing the number of process steps.

However, if a solder is used on a signal bump or a sealing bump, a gas cannot escape to the surrounding atmosphere and remains in the sealed space, resulting in serious degradation in frequency characteristics.

According to the present invention, therefore, the same bonding method is used for the signal bump and the sealing bump. More specifically, gold-tin bonding is used for the two kinds of bumps. In particular, tin is used for metalization on the parts- or module-substrate-side surface, gold is used for the bump on the SAW-chip side (the electrical connection portion and the sealing portion), and bonding is performed by heating and pressing the SAW chip. In this case, although connection and sealing are performed at the tin melting point (231.9 degrees), a tin-gold compound is formed and the remelting temperature can therefore be increased (to 280 degrees), thus enabling a bonding material having a high melting point to be used for mounting of an interposer on a mother board.

Other objects, features and advantages of the invention will become apparent from the following description of the embodiments of the invention taken in conjunction with the accompanying drawings.

DESCRIPTION OF THE PREFERRED EMBODIMENTS

Figure 1:
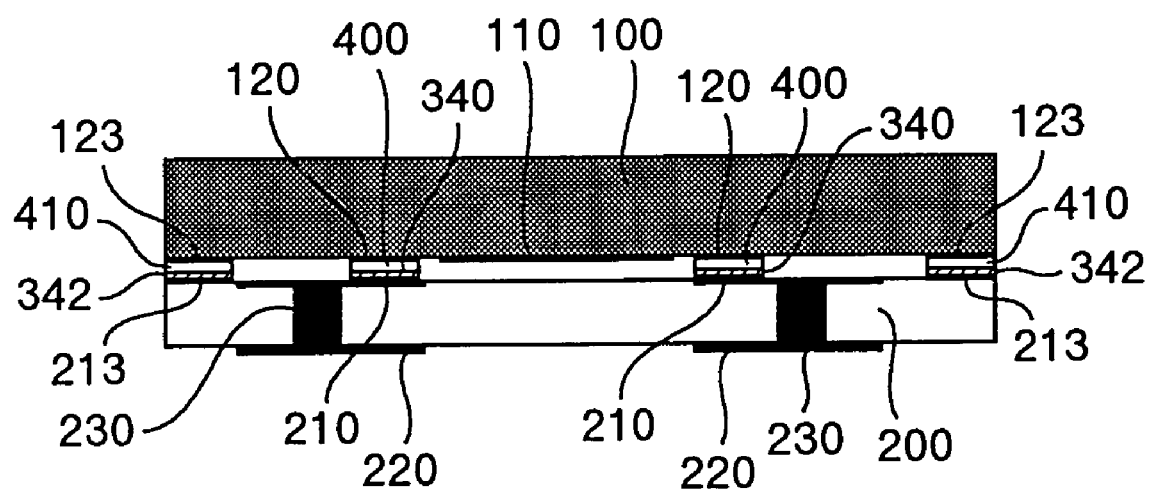
FIG. 1 is a cross-sectional view of a first embodiment of an electronic device in accordance with the present invention in which a SAW chip and a package substrate are connected.

Embodiments of the present invention will be described with reference to the drawings. Elements equivalent in functions to each other are indicated by the same reference numerals in all the drawings.

FIG. 1 is a cross-sectional view of a first embodiment of an electronic device in accordance with the present invention.

Figure 2:
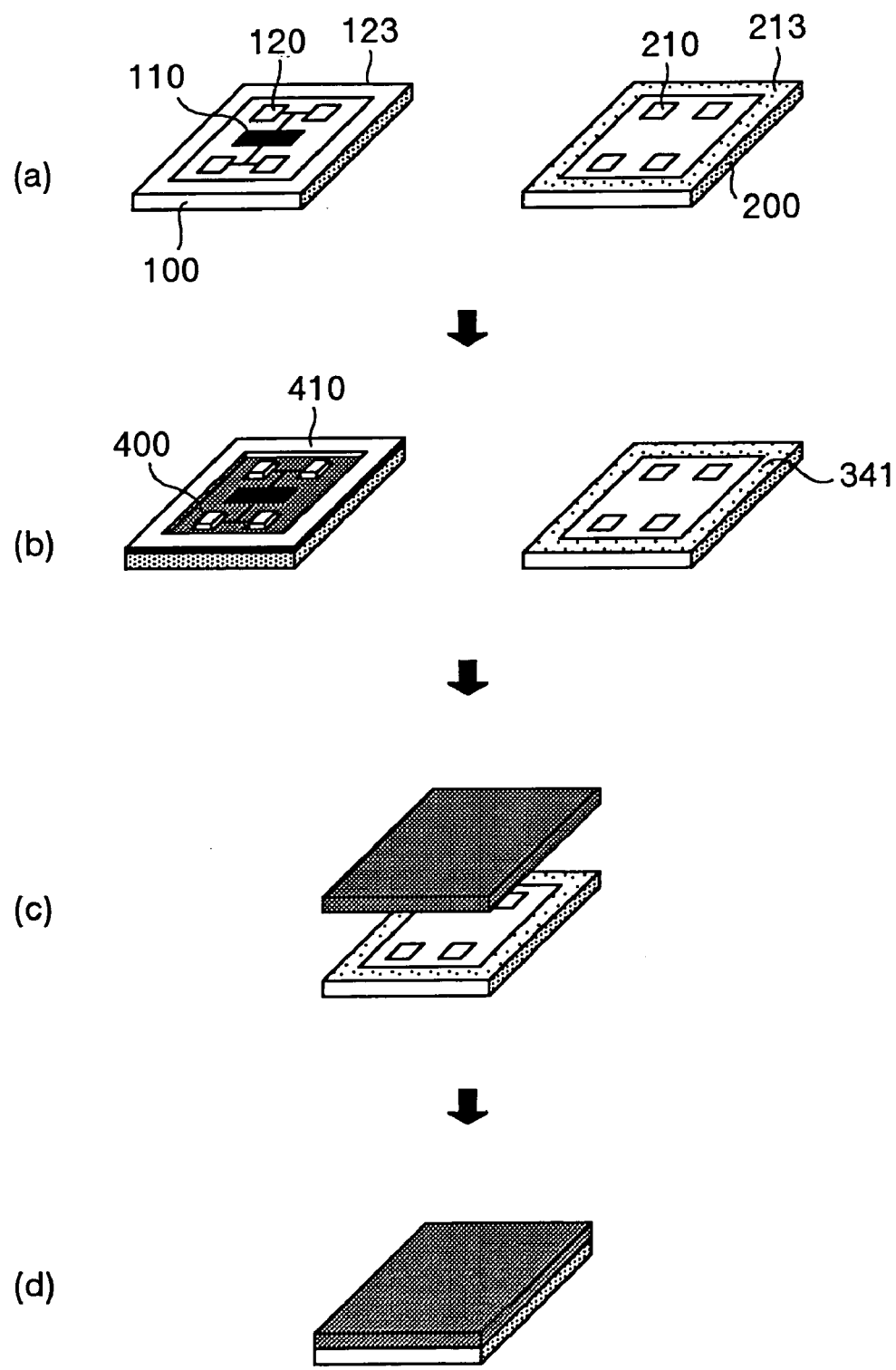
FIGS. 2(a) through 2(d) are exploded perspective views of the first embodiment of the electronic device in accordance with the present invention in which a SAW chip and a package substrate are connected.

FIG. 2 shows in more detail the first embodiment of the electronic device in accordance with the present invention. FIGS. 2(a) through 2(d) are diagrams showing the process of assembling the device shown in FIG. 1. FIG. 2(a) shows a SAW chip 100 on which wiring is formed and a package substrate 200; FIG. 2(b) shows a state where gold bumps 400 and a gold projection 410 for peripheral sealing are formed on the SAW chip 100 and a tin plating 341 is formed on the package substrate 200; FIG. 2(c) shows the step of connecting the SAW chip 100 and the package substrate 200 to each other; and FIG. 2(d) shows an external appearance after the completion of the process.

First, referring to FIG. 2(a), the SAW chip 100 is formed on which interdigital electrodes 110, chip electrodes 120 and a chip electrode 123 for peripheral sealing formed of a metal such as aluminum are formed for wiring, and the package substrate 200 is also formed on which internal electrodes 210 and an internal electrode 213 for peripheral sealing formed of a metal such as copper are formed for wiring. A substrate made of a material having high moisture resistance, e.g., a ceramic substrate, a silicon substrate or a glass substrate is preferred as the package substrate 200.

Referring to FIG. 2(b), the gold bumps 400 and the gold projection 410 for peripheral sealing are formed, for example, by plating on the chip electrode 120 and the chip electrode 123 for peripheral sealing, and the surfaces of the internal electrodes 210 and the internal electrode 213 for peripheral sealing are plated with tin. The gold bumps 400 may have any shape, e.g., the shape of a rectangular block or a cylindrical shape. Tin on the internal electrodes 210 and the internal electrode 213 for peripheral sealing may be formed by a printing method. Positioning between the SAW chip 100 and the package substrate 200 formed as described above is performed (FIG. 2(c)) and heating and pressing are performed on the SAW chip 100 and the package substrate 200. If the tin plating 341 consists only of tin, the heating temperature is set to a point equal to or higher than the tin melting point (232° C.) to melt only tin at the contact interface. Tin is molten to react with gold at the interface between the gold bumps 400, the peripheral sealing gold projection 410 and the tin plating 341, thereby forming gold-tin intermetallic compound. When tin reacts with gold, metallic bonding is effected between the gold bumps 400 and the internal electrodes 210 having the tin plating 341 applied thereto and between the peripheral sealing gold projection 410 and the internal electrode 213 for peripheral sealing having the tin plating 341 applied thereto. The melting point of the gold-tin intermetallic compound thereby formed is (metallic connection portions 340 and a connection portion 342 for peripheral sealing) is higher than the tin melting point 232° C. Therefore, even when secondary reflowing for mounting other components is performed, remelting is not caused if the reflowing temperature is lower than the gold-tin intermetallic compound melting point, and the connection between the gold bumps 400 and the internal electrodes 210 having the tin plating 341 applied thereto and the connection between the peripheral sealing gold projection 410 and the internal electrode 213 for peripheral sealing having the tin plate 341 applied thereto are maintained.

The interdigital electrodes 110 are surrounded by the peripheral sealing gold projection 410 and the gold-tin intermetallic compound on the periphery and are thereby encapsulated in an airtight manner, as shown in FIG. 2(d). The peripheral sealing portion may be used as ground.

In a case where an MCM structure in which the SAW chip 100 is mounted on an interposer substrate together with other electronic components is used, the bonding temperature at which bonding is performed at the time of mounting of the interposer substrate on a mother board can be increased.

Figure 3:
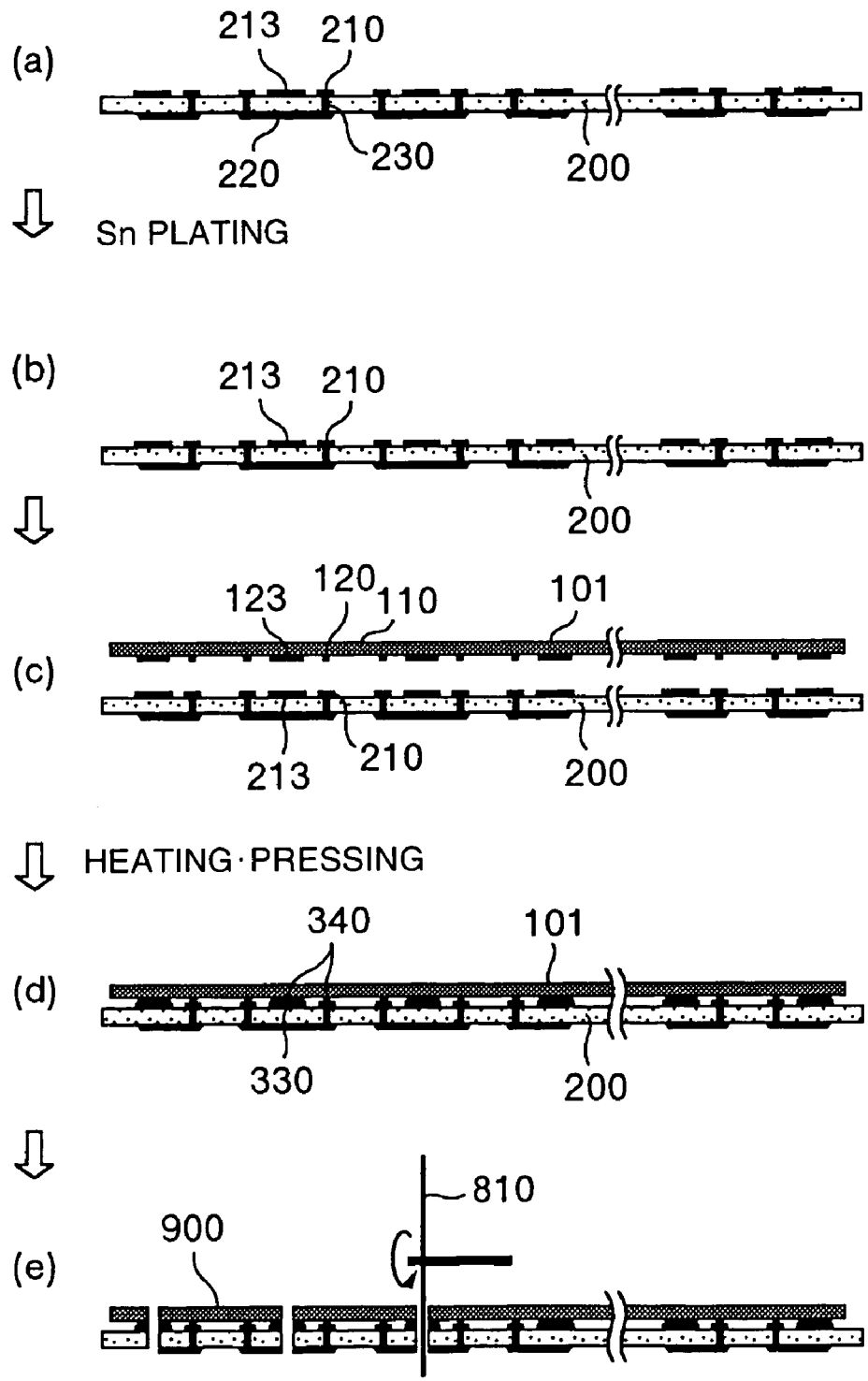
FIGS. 3(a) through 3(e) are diagrams showing the process of assembling the first embodiment of the electronic device in accordance with the present invention in which a SAW chip and a package substrate are connected.

FIGS. 3(a) through 3(e) are diagrams showing process steps according to a wafer batch forming method for the first embodiment shown in FIG. 1. In FIGS. 3(a) through 3(e), portions corresponding to those in FIGS. 1 and 2 are indicated by the same reference numerals. FIG. 3(a) shows a package substrate 200 on which wiring is formed before the package substrate 200 is cut into pieces; FIG. 3(b) shows the package substrate 200 when tin plating 341 is formed before the package substrate 200 is cut into pieces; FIG. 3(c) shows the step of positioning the package substrate 200 and a SAW wafer 101 having gold bumps 400 and peripheral sealing gold projections 410 formed on electrodes; FIG. 3(d) shows the step of bonding the SAW wafer 101 and the package substrate 200 by heating and pressing; and FIG. 3(e) shows the step of cutting the combination of the SAW wafer 101 and the package substrate 200 into pieces by dicing after connection.

First, referring to FIG. 3(a), the package substrate 200 is formed on which internal electrodes 210 and internal electrodes 213 for peripheral sealing are formed of a metal such as copper before the package substrate 200 is cut into pieces. A substrate made of a material having high moisture resistance, e.g., a ceramic substrate, a silicon substrate or a glass substrate is preferred as the package substrate 200.

Referring to FIG. 3(b), the surfaces of the internal electrodes 210 and the internal electrodes 213 for peripheral sealing are plated with tin. Tin on the internal electrodes 210 and the internal electrode 213 for peripheral sealing may be formed by using a printing method instead of plating.

As shown in FIG. 3(c), interdigital electrodes 110, chip electrodes 120 and chip electrodes 123 for peripheral sealing formed of a metal such as aluminum are formed for wiring and gold bumps 400 and peripheral sealing gold projections 410 are thereafter formed by plating on the chip electrodes 120 and the chip electrodes 123 for peripheral sealing. The gold bumps 400 may have any shape, e.g., the shape of a rectangular block or a cylindrical shape. The gold bumps 400 may be formed by performing pole bonding or the like instead of plating. Positioning between the SAW chips 100 and the package substrate 200 is performed (FIG. 3(c)) and heating and pressing are performed on the SAW chips 100 and the package substrate 200.

The difference between the linear expansion coefficients of the SAW chips on the wafer and the package substrate 200 before connection of pieces can be reduced to limit pattern misalignment between the SAW chips 100 and the package substrate 200 due to thermal shrinkage. If the tin plating 341 consists only of tin, the heating temperature is set to a point equal to or higher than the tin melting point (232° C.) to melt only tin at the contact interface. Tin is molten to react with gold at the interface between the gold bumps 400, the peripheral sealing gold projection 410 and the tin plating 341, thereby forming gold-tin intermetallic compound. When tin reacts with gold, metallic bonding is effected between the gold bumps 400 and the internal electrodes 210 having the tin plating 341 applied thereto and between the peripheral sealing gold projections 410 and the internal electrodes 213 for peripheral sealing having the tin plating 341 applied thereto. The melting point of the gold-tin intermetallic compound thereby formed is (metallic connection portions 340 and connection portions 342 for peripheral sealing) is higher than the tin melting point 232° C. Therefore, even when secondary reflowing for mounting other components is performed, remelting is not caused if the reflowing temperature is lower than the gold-tin intermetallic compound melting point, and the connection between the gold bumps 400 and the internal electrodes 210 having the tin plating 341 applied thereto and the connection between the peripheral sealing gold projections 410 and the internal electrodes 213 for peripheral sealing having the tin plate 341 applied thereto are maintained. The interdigital electrodes 110 are surrounded by the peripheral sealing gold projection 410 and the gold-tin intermetallic compound on the periphery and are thereby encapsulated in an airtight manner, as shown in FIG. 3(d). The peripheral sealing portion may be used as ground. If the structure shown in FIG. 3(d) is formed by the above-described process, a package having good moisture resistance and improved reliability can be provided.

Figure 7:
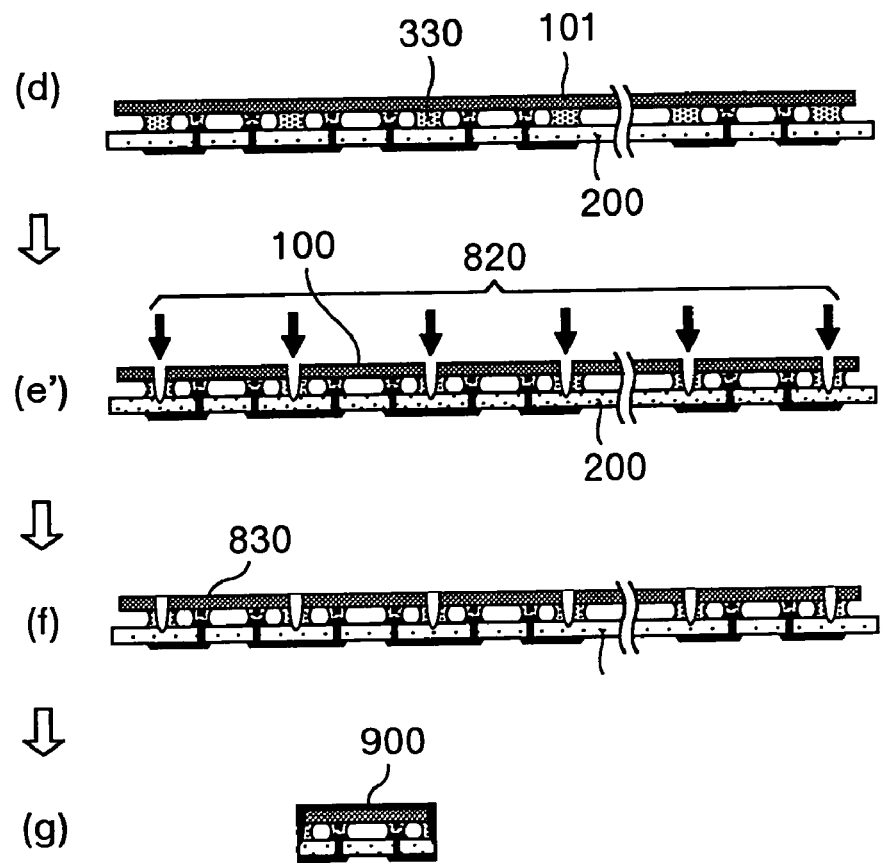
FIGS. 7(d) to 7(g) are diagrams showing another example of the process of assembling the second embodiment of the chip-side surface acoustic wave device in accordance with the present invention.

Finally, the combination of the SAW wafer and the package substrate 200 is cut into pieces by using a dicer, as shown in FIG. 3(e). The first embodiment shown in FIG. 1 is thus realized. For this cutting, a cutting method using a router or sandblasting such as shown in FIG. 7 may be used. Besides the above-described advantages, the advantage of reducing the tact time by changing the connection process from individual piece connection to batch connection and by performing a batch cutting process for cutting the SAW chips 100 and the package substrate 200 can be provided. Also, since cutting is performed after encapsulation of the interdigital electrodes 110, occurrence of a defect due to mixing of a foreign substance can be prevented.

Figure 4:
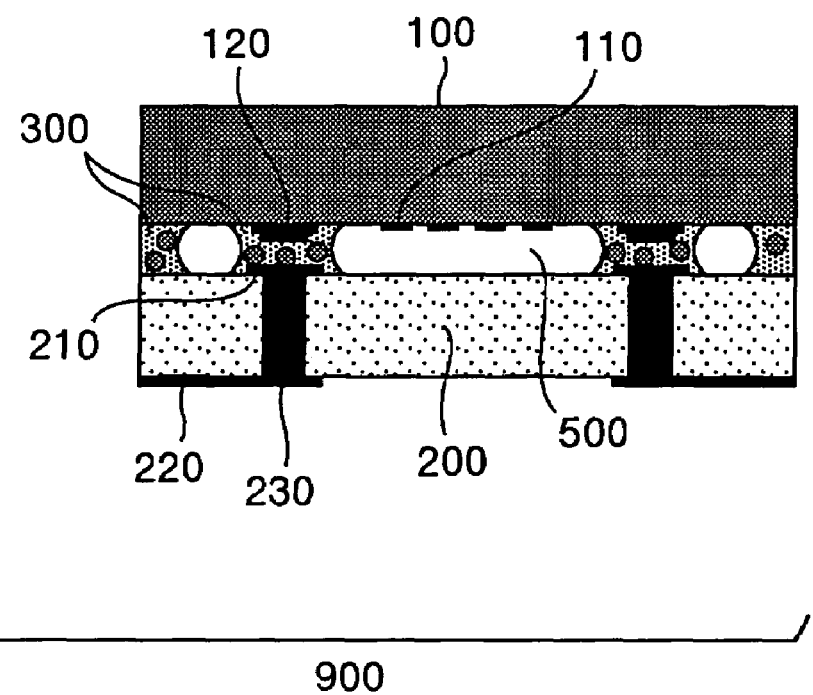
FIG. 4 is a cross-sectional view of a second embodiment of the electronic device in accordance with the present invention in which a SAW chip and a package substrate are connected.

FIG. 4 is a cross-sectional view of a surface acoustic wave device 900 of a chip size which is a second embodiment of the electronic device in accordance with the present invention. The surface acoustic wave device 900 has a structure in which a SAW chip 100 is connected to and sealed on a package substrate 200 by using electroconductive glass 300. Internal electrodes 210, external electrodes 220 and through holes 230 for connection between the internal electrodes 210 and the external electrodes 220 are formed on the package substrate 200 in advance.

The structure shown in FIG. 4 is formed in such a manner that glass balls of several microns are mixed as a spacer in electroconductive glass 300 to control the connection height, thereby ensuring that a space 500 can be formed along the interdigital electrode 110 portion. As a spacer material alternative to the glass balls, glass rods or electroconductive particles such as Ni balls plated with Au may be used. Electroconductive glass 300 electrically connects SAW chip electrodes 120 and the internal electrodes 210 on the package substrate 200 and seals a peripheral portion of the SAW chip 100.

Figure 5:
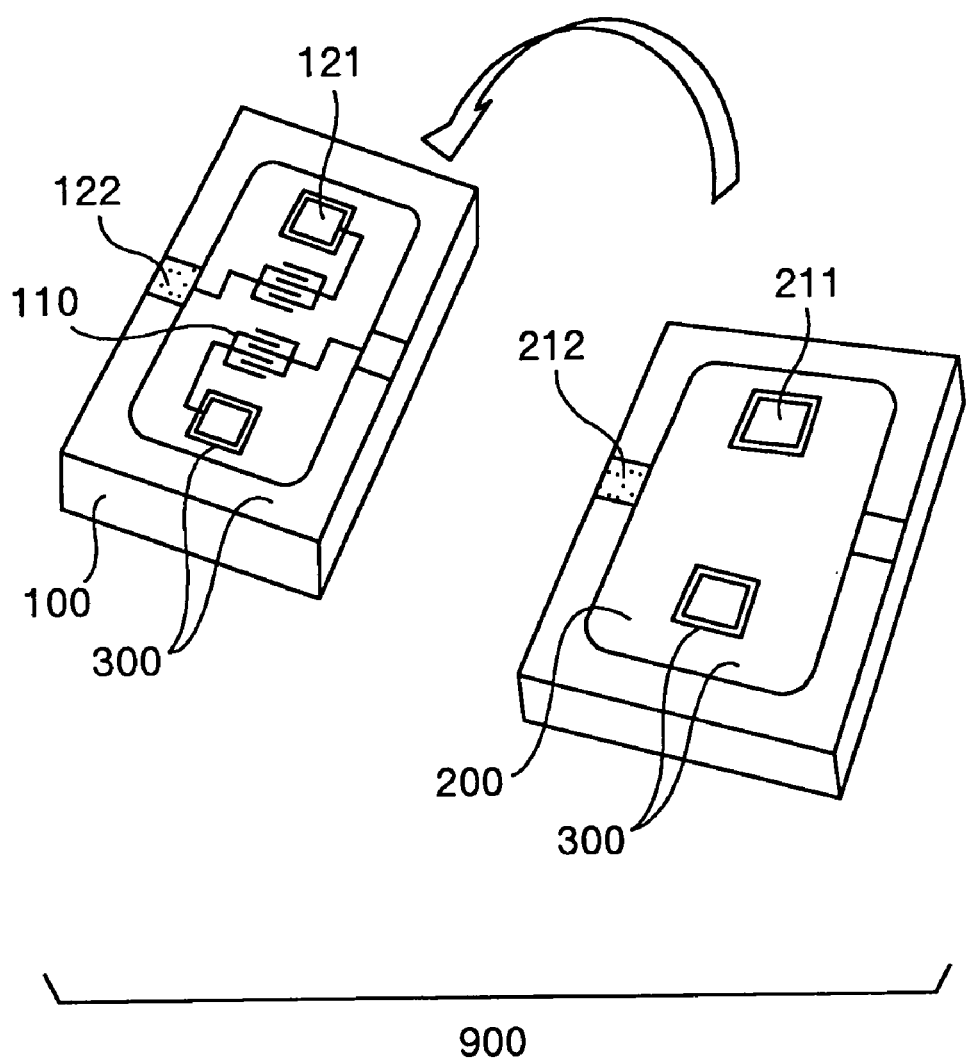
FIG. 5 is an exploded perspective view of the second embodiment of the electronic device in accordance with the present invention in which a SAW chip and a package substrate are connected.

FIG. 5 is an exploded perspective view of the above-described chip-size surface acoustic wave device 900, showing a state where the SAW chip 100 is removed from the package substrate 200 by cutting at electroconductive glass 300. Electroconductive glass 300 is placed so as to connect signal chip electrodes 121 on the SAW chip 100 and signal internal electrodes 211 on the package substrate 200 and to seal a peripheral portion of the SAW chip 100. A GND chip electrode 122 is connected to a GND internal electrode 212 on the package substrate 200. The GND chip electrode 122 also used for peripheral sealing on the SAW chip 100.

FIGS. 6(a) through 6(e) are diagrams showing the process of assembling the above-described chip-size surface acoustic wave device 900. Referring to FIG. 6(a), internal electrodes 210, the package substrate 200 on which external electrodes 220 and through holes 230 for connecting these electrodes are formed in advance is prepared. Referring to FIG. 6(b), a frit for electroconductive glass 300 is printed and molten on the SAW chip mount surface of the above-described package substrate 200 to supply electroconductive glass to the desired position on the package substrate 200.

Referring to FIG. 6(c), a SAW wafer 101 is opposed to and placed on the package substrate 200 on which electroconductive glass 300 is attached, and heating and pressing are performed on the SAW wafer 101 and the package substrate 200 and the package substrate 200 placed one on another.

FIG. 6(d) shows a connected state after the above-described step. The SAW wafer 101 is connected to the chip electrodes 120 and the internal electrodes 210 of the multiple-piece-forming package substrate 200, and peripheral sealing with electroconductive glass 300 is effected on a peripheral portion of each SAW chip.

Referring to FIG. 6(e), the chip-size surface acoustic wave device 900 can be obtained by cutting and separation with a dicer 810 at centers of sealing portions 330 on the multiple-piece-forming package substrate 200.

Figure 6:
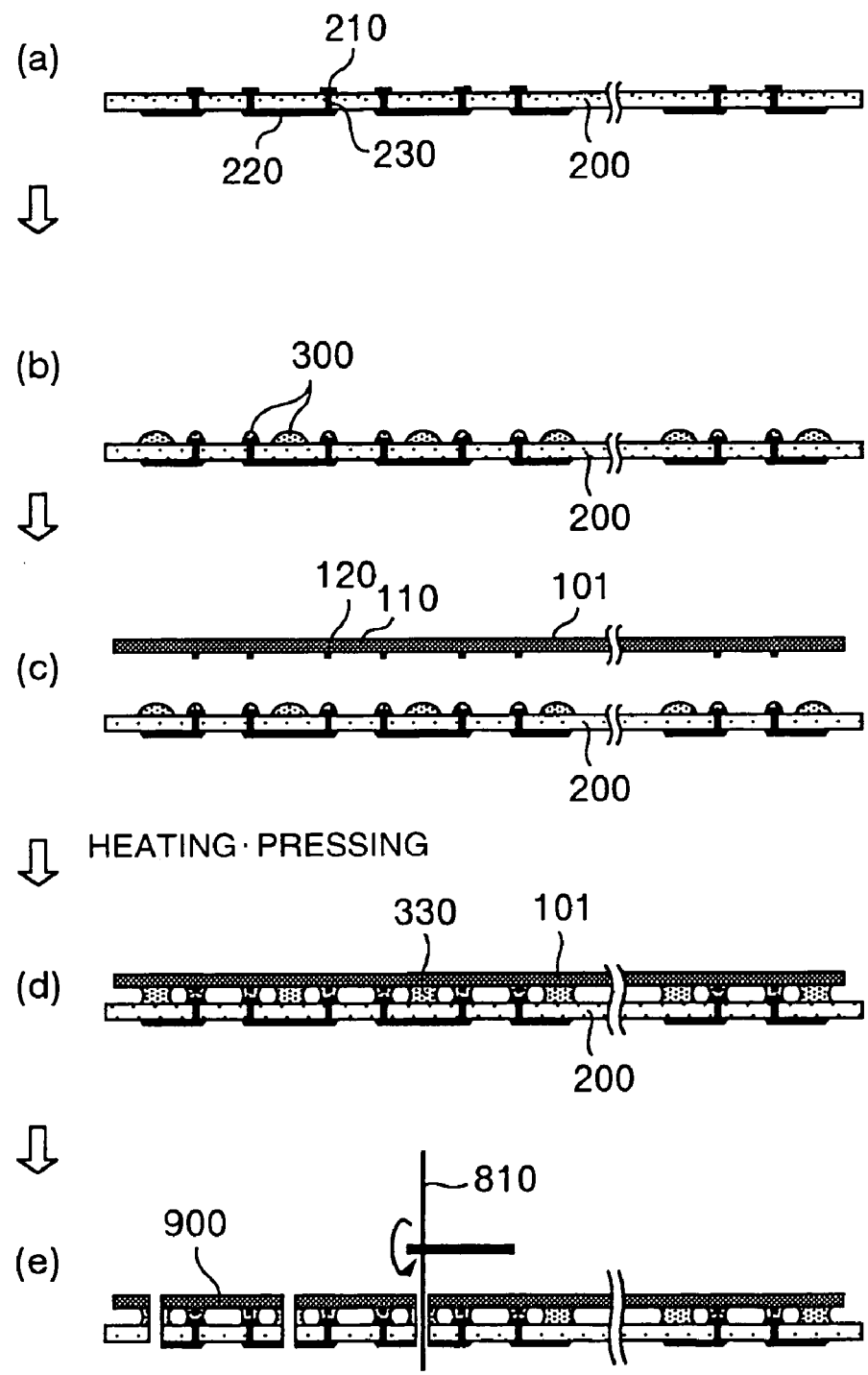
FIGS. 6(a) through 6(e) are diagrams showing the process of fabricating the second embodiment of the electronic device in accordance with the present invention in which a SAW chip and a package substrate are connected.

FIGS. 7(d) through 7(g) are diagrams showing assembly process steps as a modification after the step (d) described with reference to FIG. 6. Referring to FIG. 7(e'), grooving in the direction of mounting of SAW wafer 101 to a depth reaching the package substrate 200 is performed by sandblasting 820 at centers of sealing portions 330 on the multiple-piece-forming package substrate 200 to which the SAW wafer 101 is connected in a sealing manner, thereby separating SAW chips 100.

Referring then to FIG. 7(f), the entire back surfaces of the SAW chips 100 including the grooved portions are metalized by evaporation or plating. Cu, Ni or Al is used as a metal for this metalization. The entire surface may be coated with an electroconductive coating material.

Finally, referring to FIG. 7(g), the grooved portions of the package substrate 200 are broken or cut by dicing to be separated, thereby obtaining individual chip-size surface acoustic wave devices.

Figure 8:
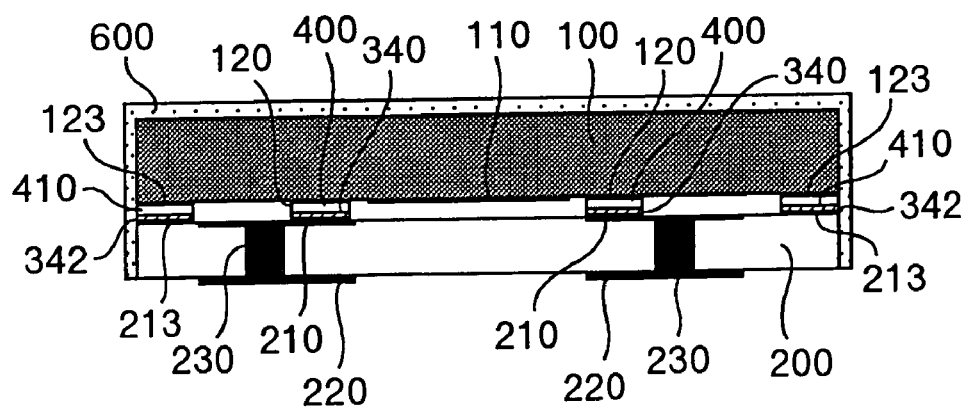
FIG. 8 is a cross-sectional view of a third embodiment of the electronic device in accordance with the present invention in which a SAW chip and a package substrate are connected.

FIG. 8 is a cross-sectional view of a third embodiment of the electronic device in accordance with the present invention. In FIG. 8, portions corresponding to those in FIG. 1 are indicated by the same reference numerals. A portion 600 is a shielding member.

The structure shown in FIG. 8 is formed in such a manner that the chip surface and side surfaces in the structure proposed in the first embodiment are sealed with a shielding member. A metallic member or a member surrounded by a metal on the periphery, e.g., a resin member coated with a metal is preferred as the shielding member 600. The provision of the shielding member 600 is effective in preventing the influence of electromagnetic waves from other components and in preventing the chip from being chipped by an external force. The shielding member 600 can also be used as ground by being connected to the peripheral sealing portion. Further, a heat dissipation effect can be expected. The shielding member 600 may be formed, for example, by a method of forming a layer of a resin on the periphery by molding and thereafter plating the surface with a metal, a method of applying a waterproof material or a material containing metal particles by spraying or a method of attaching a metallic cap.

Figure 9:
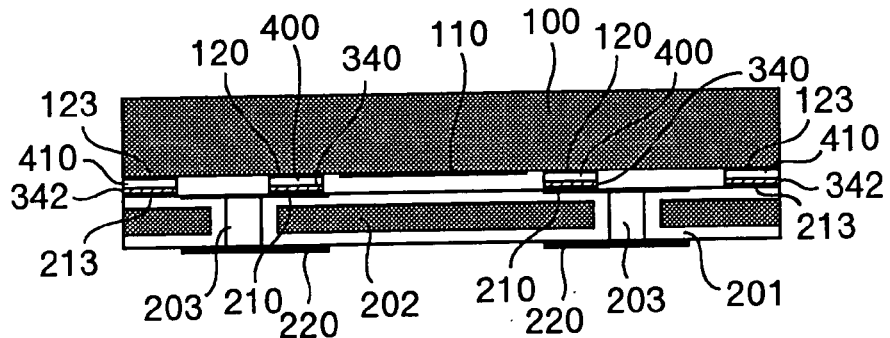
FIG. 9 is a cross-sectional view of a fourth embodiment of the electronic device in accordance with the present invention in which a SAW chip and a package substrate are connected.

FIG. 9 is a cross-sectional view of a fourth embodiment of the electronic device in accordance with the present invention. In FIG. 9, portions corresponding to those in FIG. 1 are indicated by the same reference numerals. A portion 201 is a resin layer, a portion 202 is a core metal, and a portion 203 is a through hole.

In this embodiment, interdigital electrodes 110, gold bumps 400, chip electrodes 120, a projection 410 for peripheral sealing and a chip electrode 123 for peripheral sealing are provided on a SAW chip 100, and a metal core substrate is formed in such a manner that resin layers 201 are attached to two surfaces of a core metal 202 and wiring is thereafter formed by forming internal electrodes 210, external electrodes 220, an internal electrode 213 for peripheral sealing, tin plating 341, and through holes 203. The core metal 202 is made of, for example, a metal such as copper, aluminum or 42 alloy, and the linear expansion coefficient of the metal core substrate can be adjusted by selecting the combination with the number of resin layers 201. This embodiment is realized by forming the above-described SAW chip 100 and the metal core substrate by the process shown in FIG. 2, 3 or 7.

In this embodiment, since the linear expansion coefficient of the metal core substrate can be adjusted by selecting the combination of core metal 202 and resin layers 201, a package substrate having an extremely small linear expansion coefficient difference from the SAW chip 100 can be formed. The stress caused by variation in temperature is thereby limited to improve the reliability of the connection portions. Also, the peripheral sealing portion can be provided as a ground terminal by being connected to the core metal 202.

The core metal 202 can also be used as barrier against electromagnetic waves to prevent the influence of electromagnetic waves from other components.

Figure 10:
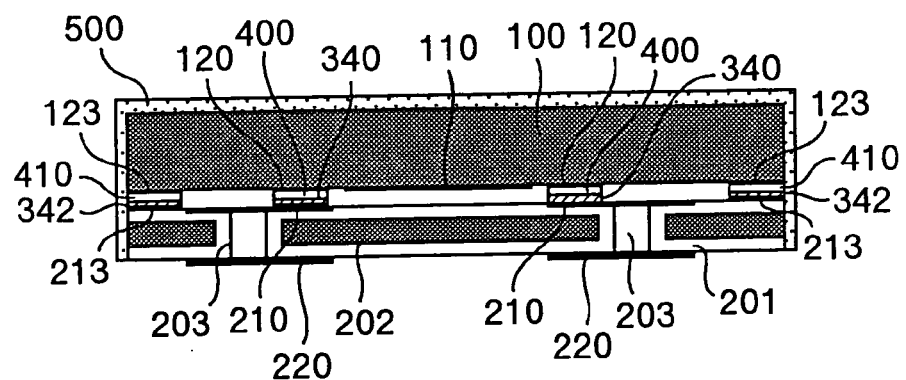
FIG. 10 is a cross-sectional view of a fifth embodiment of the electronic device in accordance with the present invention in which a SAW chip and a package substrate are connected.

FIG. 10 is a cross-sectional view of a fifth embodiment of the electronic device in accordance with the present invention. In FIG. 10, portions corresponding to those in FIGS. 8 and 9 are indicated by the same reference numerals. A portion 600 is a shielding member.

The structure shown in FIG. 10 is formed in such a manner that the chip surface and side surfaces in the structure proposed in the fourth embodiment are sealed with a shielding member. A metallic member or a member surrounded by a metal on the periphery, e.g., a resin member coated with a metal is preferred as the shielding member 600.

This embodiment has, in addition to the advantage of the fourth embodiment, the advantage of the provision of the shielding member 600 effective in preventing the influence of electromagnetic waves from other components and in preventing the chip from being chipped by an external force. Since the peripheral sealing portion and the core metal 202 can be connected by the shielding member 600, these members can easily be used as ground. Further, a heat dissipation effect can be expected. The shielding member 600 may be formed, for example, by a method of forming a layer of a resin on the periphery by molding and thereafter plating the surface with a metal, a method of applying a waterproof material or a material containing metal particles by spraying or a method of attaching a metallic cap.

Figure 11:
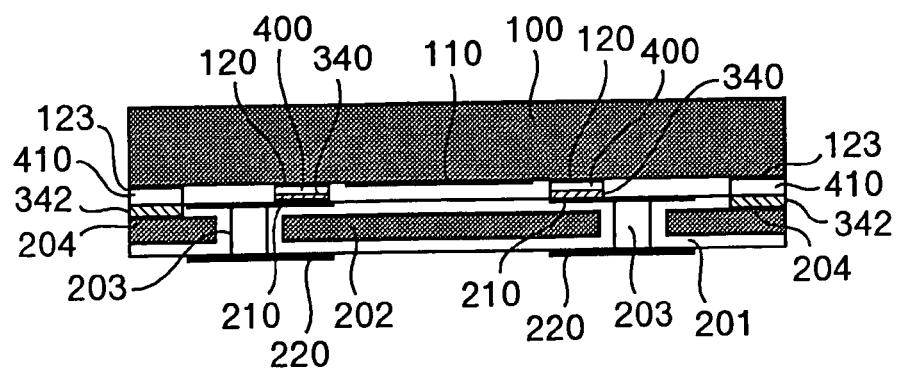
FIG. 11 is a cross-sectional view of a sixth embodiment of the electronic device in accordance with the present invention in which a SAW chip and a package substrate are connected.

FIG. 11 is a cross-sectional view of a sixth embodiment of the electronic device in accordance with the present invention. In FIG. 11, portions corresponding to those in FIG. 9 are indicated by the same reference numerals. A portion 204 is a metalizing on a core metal 202.

In this embodiment, interdigital electrodes 110, gold bumps 400, chip electrodes 120, a projection 410 for peripheral sealing and a chip electrode 123 for peripheral sealing are provided on a SAW chip 100, and a metal core substrate is formed in such a manner that resin layers 201 are attached to two surfaces of a core metal 202 and wiring is thereafter formed by forming internal electrodes 210, external electrodes 220, the metalizing 204, tin plating 341, and through holes 203. The core metal 202 is made of, for example, a metal such as copper, aluminum or 42 alloy, and the linear expansion coefficient of the metal core substrate can be adjusted by selecting the combination with the number of resin layers 201. The above-described SAW chip 100 and the metal core substrate are formed by the process shown in FIG. 2, 3 or 7. In this embodiment, holes are formed in advance in the resin layers 201 at positions at which the external sealing portion is formed. The core metal 202 is thereby exposed. These holes can be formed by laser machining or etching. Metalizing 204 is formed in these holes as required and tin plating 341 is further formed. Metalizing 204 is required in a case where it is difficult to form tin plating 341 on the core metal 202. A metal for this metalizing is copper, nickel or gold, for example. Positioning between the metal core substrate on which tin plating 341 is formed and the above-described SAW chip 100 is performed and heating and pressing are performed on the metal core substrate and the SAW chip 100, thus realizing this embodiment.

This embodiment has the advantage of connecting the peripheral sealing portion and the core metal 202 without forming internal wiring in addition to the advantage of the fourth embodiment.

Figure 12:
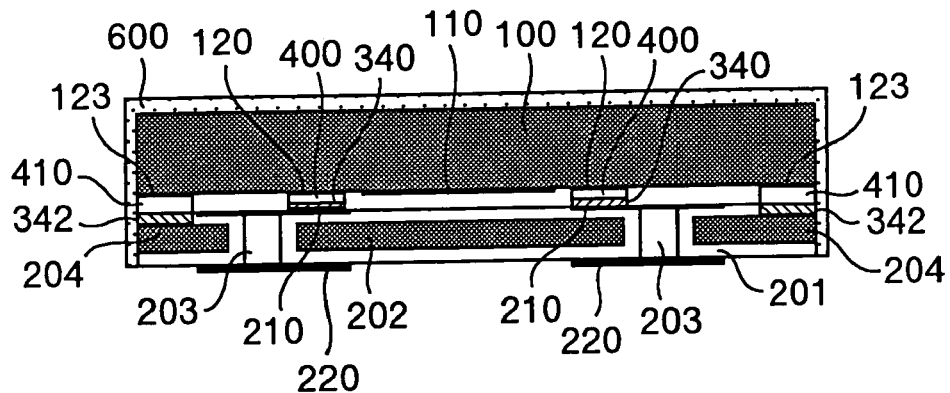
FIG. 12 is a cross-sectional view of a seventh embodiment of the electronic device in accordance with the present invention in which a SAW chip and a package substrate are connected.

FIG. 12 is a cross-sectional view of a seventh embodiment of the electronic device in accordance with the present invention. In FIG. 12, portions corresponding to those in FIGS. 8 and 9 are indicated by the same reference numerals.

The structure shown in FIG. 12 is formed in such a manner that the chip surface and side surfaces in the structure proposed in the sixth embodiment are sealed with a shielding member. A metallic member or a member surrounded by a metal on the periphery, e.g., a resin member coated with a metal is preferred as the shielding member 600.

This embodiment has, in addition to the advantage of the sixth embodiment, the advantage of the provision of the shielding member 600 effective in preventing the influence of electromagnetic waves from other components and in preventing the chip from being chipped by an external force. The shielding member 600 may be formed, for example, by a method of forming a layer of a resin on the periphery by molding and thereafter plating the surface with a metal, a method of applying a waterproof material or a material containing metal particles by spraying or a method of attaching a metallic cap.

Figure 13:
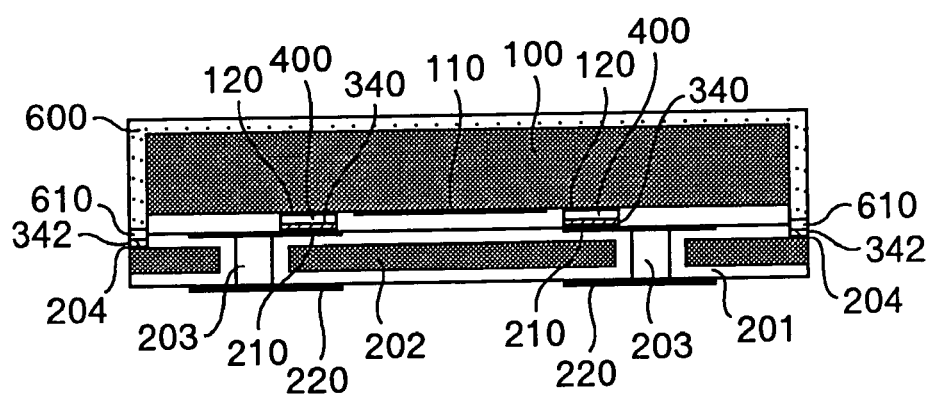
FIG. 13 is a cross-sectional view of an eighth embodiment of the electronic device in accordance with the present invention in which a SAW chip and a package substrate are connected.

FIG. 13 is a cross-sectional view of an eighth embodiment of the electronic device in accordance with the present invention. In FIG. 13, portions corresponding to those in FIGS. 8 and 9 are indicated by the same reference numerals.

In this embodiment, interdigital electrodes 110, gold bumps 400 and chip electrodes 120 are provided on a SAW chip 100, and a metal core substrate is formed in such a manner that resin layers 201 are attached to two surfaces of a core metal 202 and wiring is thereafter formed by forming internal electrodes 210, external electrodes 220, a metalizing 204, tin plating 341, and through holes 203. A shielding member (cap) 600 having gold plating 610 for connection of a shielding material also constitutes the device. The core metal 202 is made of, for example, a metal such as copper, aluminum or 42 alloy, and the linear expansion coefficient of the metal core substrate can be adjusted by selecting the combination with the number of resin layers 201. A metallic cap or a member surrounded by a metal on the periphery, e.g., a resin cap coated with a metal is preferred as the shielding member 600. In this embodiment, holes are formed in advance in the resin layers 201 at positions at which the external sealing portion is formed. The core metal 202 is thereby exposed. These holes can be formed by laser machining or etching. Metalizing 204 is formed in these holes as required and tin plating 341 is further formed. Metalizing 204 is required in a case where it is difficult to form tin plating 341 on the core metal 202. A metal for this metalizing is copper, nickel or gold, for example. The above-described SAW chip 100 and metal core substrate are connected by the process shown in FIG. 2, 3 or 7 and the above-described shielding member 600 is also connected, thus realizing this embodiment. A solder may be substituted for the gold plating 610 for connection of the shielding member.

This embodiment has, in addition to the advantage of the seventh embodiment, the advantage of eliminating the need for the step for peripheral sealing and protection from an external force because connection between the SAW chip 100 and the metal core substrate and cap 600 sealing can be performed at a time.

Figure 14:
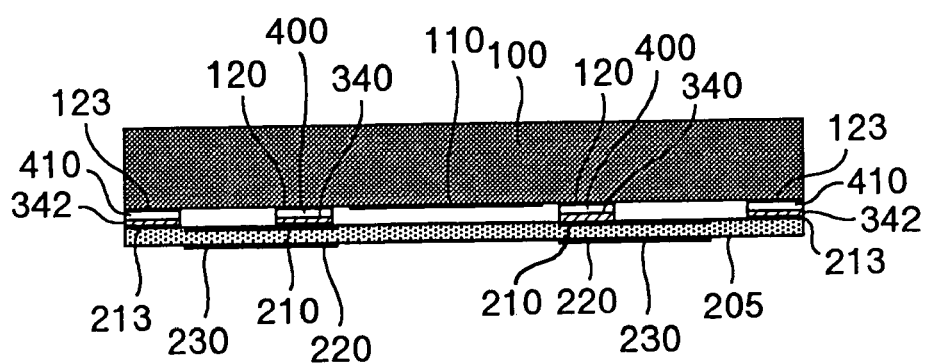
FIG. 14 is a cross-sectional view of a ninth embodiment of the electronic device in accordance with the present invention in which a SAW chip and a package substrate are connected.

FIG. 14 is a cross-sectional view of a ninth embodiment of the electronic device in accordance with the present invention. In FIG. 14, portions corresponding to those in FIG. 8 are indicated by the same reference numerals.

In this embodiment, interdigital electrodes 110, gold bumps 400, a projection 410 for peripheral sealing and chip electrodes 120 are provided on a SAW chip 100, and a flexible substrate 205 having internal electrodes 210, external electrodes 220, metalizing 204, pin plating 341 and through holes 203 is formed. In this embodiment, tin plating 341 is formed on the internal electrodes 210 and the external electrodes 220 or all pieces of wiring on the device connection surface of the flexible substrate 205 having on its front and back surfaces pieces of wiring, the internal electrodes 210 and the external electrodes 220 formed of copper, for example. Metalizing 204 is formed if it is difficult to form tin plating 341 on the wiring, internal electrodes 210 and external electrodes 220. Metalizing 204 is formed of nickel or gold, for example. This embodiment is realized by connecting the above-described SAW chip 100 and the flexible substrate 205 by the process shown in FIG. 2 or 3. A shielding member 600 may be formed on the periphery as shown in FIG. 8. A solder may be substituted for the gold plating 610 for connection of the shielding member.

This embodiment has, in addition of the advantage of the first embodiment, the advantage that since the rigidity of the flexible substrate 205 is low, the flexible substrate 205 can be deformed to reduce the concentration of stress to the connection portions even when a difference occurs between the amounts of shrinkage of the SAW chip 100 and the flexible substrate 205 due to variation in temperature in an operating environment. Since the flexible substrate is thinner than printed substrates and ceramic substrates, it is possible to provide thinner electronic circuit elements by using the flexible substrate.

Figure 15:
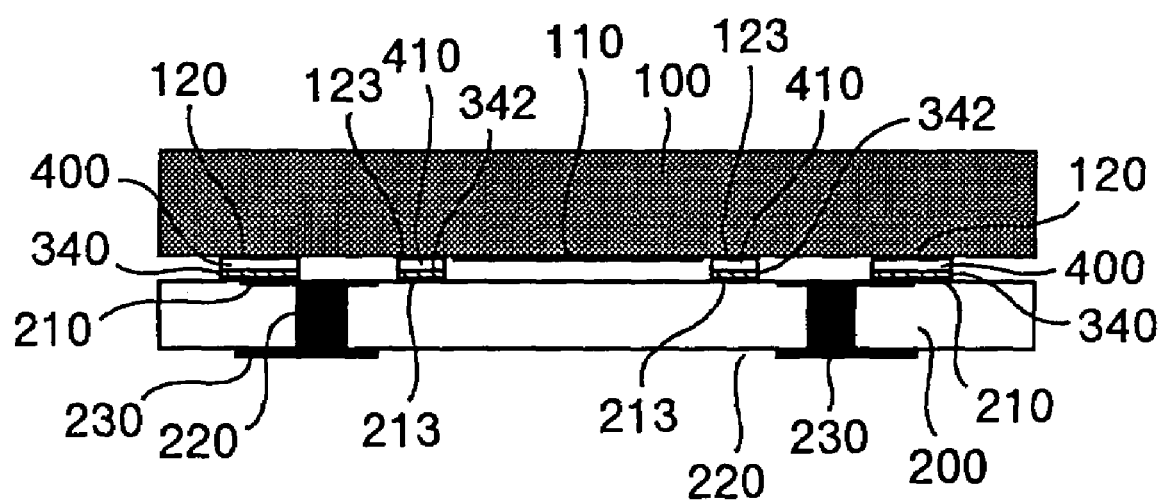
FIG. 15 is a diagram showing another example of peripheral sealing in the electronic device in accordance with the present invention in which a SAW chip and a package substrate are connected.

While the embodiments 2 to 9 have been described by assuming that the plating material on the internal electrode 213 for peripheral sealing and the internal electrodes 210 on the package substrate 200 is Sn, Ag or Au may be substituted for Sn to effect Au—Ag, Au—Al or Au—Au diffusion bonding between the peripheral sealing chip electrode 123 and the Au bumps on the chip electrodes 120 on the SAW wafer 101. Further, the peripheral sealing portion may be formed so as to surround the interdigital electrodes 110 as shown in FIG. 15.

A method of selectively performing Au plating on the chip electrodes 120 or the peripheral sealing chip electrode 123 on the SAW wafer 101 will be described with respect to the case of plating on the chip electrodes 120 by way of example with reference to FIGS. 16(*a*) through 16(*g*).

Figure 16:
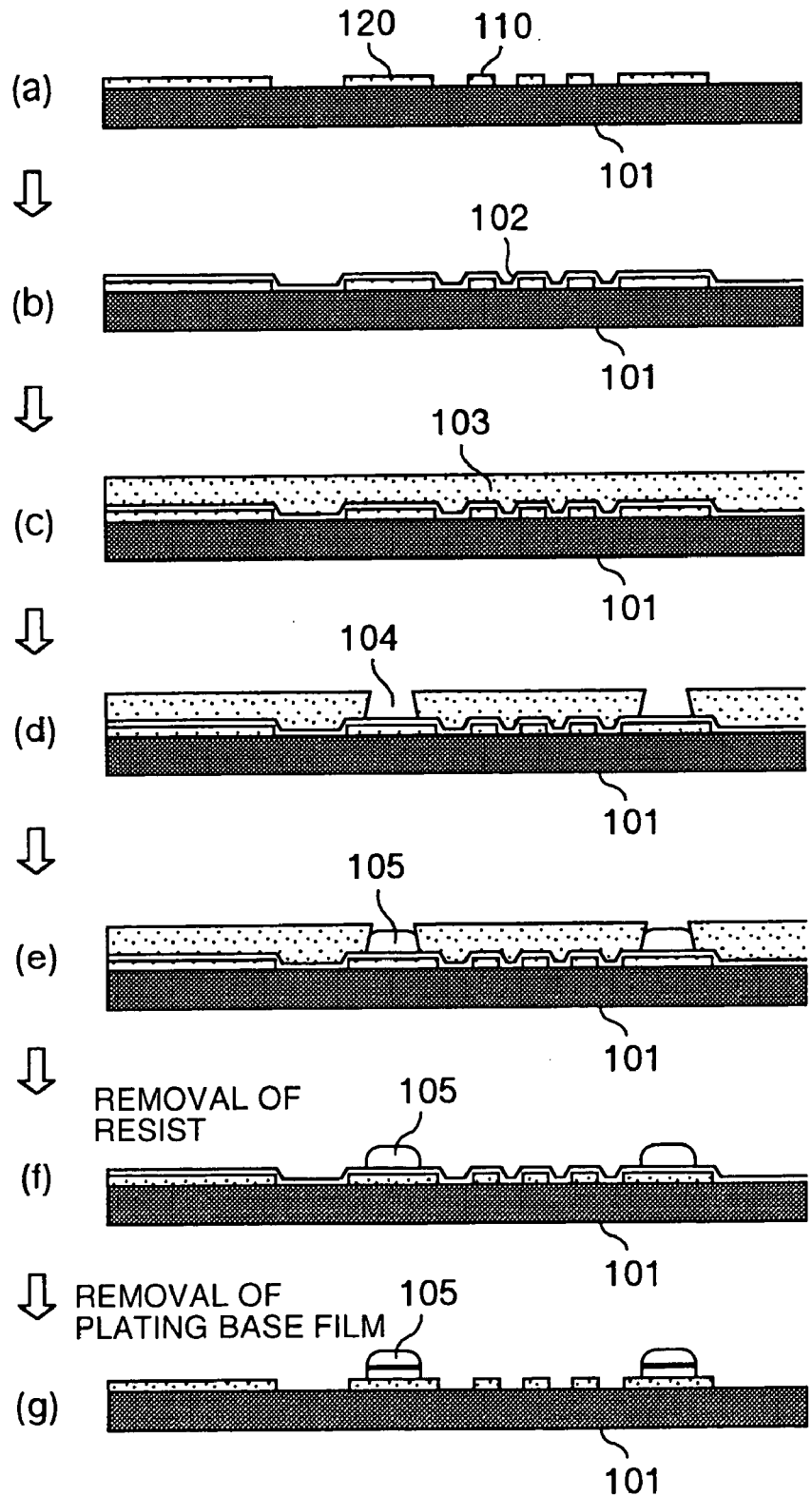
FIGS. 16(a) through 16(g) are diagrams showing the process of gold plating on a SAW wafer in accordance with the present invention.
Figure 17:
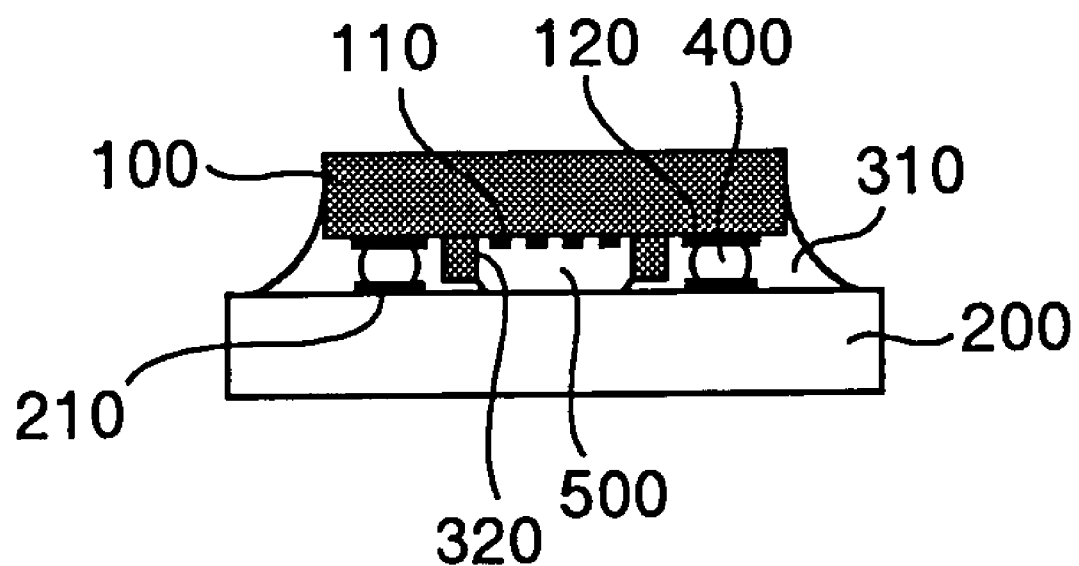
FIG. 17 is a diagram schematically showing a conventional small surface acoustic wave device.

Referring to FIG. 16(*a*), a SAW wafer on which interdigital electrodes 110 and chip electrodes 120 are formed is prepared.

Referring to FIG. 16(*b*), film of Cr or Cu is formed as a plating base film 102 on the chip electrode 120 formation surface of the above-described SAW wafer 101 by sputtering or evaporation.

Referring to FIG. 16(*c*), a plating resist film 103 is formed by spin coating on the SAW wafer 101 on which the plating base film 102 is formed, followed by heating to set the resist film.

Referring to FIG. 16(*d*), portions of the SAW wafer 101 corresponding to the chip electrodes 120 after application and setting of the plating resist film 103 on the SAW wafer 101 are irradiated with ultraviolet rays and undergo development. The resist film 103 is selectively removed at 104 by this patterning.

Referring to FIG. 16(*e*), electrolytic Au plating 105 is performed on the portions corresponding to the chip electrodes 120, from which the plating resist film 103 has been removed at 104 by patterning.

Referring to FIG. 16(*f*), the entire plating resist film 103 is removed by using acetone for example.

Referring to FIG. 16(*g*), the plating base film 102 formed of Cr or Cu is selectively removed by etching using diammonium cerium nitrate so as not to affect Al of the interdigital electrodes 110 and the chip electrodes 120, thus forming the SAW wafer 101 with the desired Au plating pattern.

The present invention has been described concretely with respect to the embodiments thereof. Needless to say, the present invention is not limited to the described embodiments and various changes and modifications can be made in the described embodiments without departing from the gist of the invention.

The advantages obtained in typical instances of the present invention disclosed in the specification for application of the present invention will be briefly described below.

In the chip-size surface acoustic wave device of the present invention, an electroconductive glass or a metallic bonding material having low flowability is used as sealing material and the sealing material can therefore be prevented from flowing to the interdigital electrodes even if no flow prevention frame is provided, and a reduction in parts cost and a reduction in assembly cost corresponding to the flow prevention frame can be expected. Also, complete airtight sealing can be achieved to improve the reliability. Further, sealing and electrode connection are performed on the wafer level and individual SAW chip package devices are separated at the final step. Therefore, the device can be reduced to the chip size and can be manufactured in a wafer-size batch process. As a result, remarkable reduction in manufacturing cost can be achieved.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. An electronic device comprising a substrate and an electronic circuit element flip-chip-connected on said substrate,
   wherein a connection is made by gold-tin (Au-Sn) bonding between a chip electrode of said electronic circuit element and an internal electrode on said substrate, and
   the connection is sealed between said electronic circuit element and said substrate opposed to said electronic circuit element in a peripheral connection also formed therebetween by the gold-tin bonding, and
   an alloy containing gold and tin is formed in each of the connection and the peripheral connection.

2. The electronic device according to claim 1, wherein said electronic circuit element comprises a piezoelectric element.

3. The electronic device according to claim 1, wherein said electronic circuit element comprises a SAW chip, a thin film bulk acoustic resonator (FBAR) or a microelectromechanical system (MEMS).

4. The electronic device according to claim 1, wherein said the surface of the electrode on said electronic circuit element is plated with gold (Au) and the surface of the internal electrode on said substrate is plated with tin (Sn).

5. The electronic device according to claim 1, wherein said substrate comprises a printed substrate or a flexible substrate.

6. The electronic device according to claim 1, wherein said substrate comprises a metal core substrate.

7. The electronic device according to claim 1, wherein said substrate comprises a glass substrate or a ceramic substrate.

8. The electronic device according to claim 1, wherein said substrate comprises a silicon substrate.

9. The electronic device according to claim 6, wherein the metal core substrate has a core metal and a resin layer attached to a surface of the core metal opposite to the electronic circuit element,
   a portion of the surface the core metal exposed from the resin layer is metalized to form the peripheral connection formed thereon, and the peripheral connection and the core metal are electrically connected to each other.

10. The electronic device according to claim 1, wherein the alloy containing gold and tin is a gold-tin intermetallic compound.

11. The electronic device according to claim 10,
wherein a melting point of the gold-tin intermetallic compound is higher than that of tin.

12. The electronic device according to claim 10,
wherein the chip electrode and a first metal layer surrounding the chip electrode are formed on a surface of the electronic circuit element opposite to a surface of the substrate,
the internal electrode and a second metal layer surrounding the internal electrode are formed on the surface of the substrate opposite to the surface of the electronic circuit element, and
the peripheral connection including the alloy containing gold and tin is formed between the first metal layer and the second metal layer.

13. The electronic device according to claim 12,
wherein a gold bump is formed on the chip electrode,
a gold projection is formed on the first metal layer,
a tin layer is formed on each of a surface of the internal electrode and a surface of the second metal layer both opposite to the surface of the electronic circuit element,
the alloy containing gold and tin is formed in the connection at an interface between the tin layer on the internal electrode and the gold bump contacting with each other, and
the alloy containing gold and tin is formed in the peripheral connection at an interface between the tin layer on the second metal layer and the gold projection contacting with each other.

14. The electronic device according to claim 13,
wherein each of the alloys containing gold and tin formed in the connection and the peripheral connection is the gold-tin intermetallic compound having a melting point higher than that of tin.

15. The electronic device according to claim 13,
wherein each of the tin layers on the internal electrode and the second metal layer consists only of tin.

16. The electronic device according to claim 13,
wherein the tin layer is formed by plating each of the internal electrode and the second metal layer with tin.

17. The electronic device according to claim 13,
wherein the chip electrode and the first metal layer are formed of aluminum.

18. The electronic device according to claim 13,
wherein the internal electrode and the second metal layer are formed of copper.

19. The electronic device according to claim 1,
wherein the alloy containing gold and tin is formed by melting the tin layers at the respective interfaces between the tin layer on the internal electrode and the gold bump and between the tin layer on the second metal layer and the gold projection.

20. The electronic device according to claim 1,
wherein the connection is encapsulated in an airtight manner between the electronic circuit element and the substrate opposed to each other by the peripheral connection.

21. An electronic device comprising:
an electronic circuit element having a first surface on which a first electrode is formed; and
a substrate having a second surface arranged opposite to the first surface, and a second electrode electrically being formed on the second surface and connected to the first electrode,
wherein a sealing member is formed between the first surface of the electronic circuit element and the second surface of the substrate to surround the first electrode in the first surface and the second electrode in the second surface,
the sealing member has an alloy including tin (Sn) and gold (Au) being formed therein and having a melting point higher than the melting point of tin.

22. The electronic device according to claim 21,
wherein the alloy including tin and gold is a gold-tin intermetallic compound.

* * * * *